(12) United States Patent
England

(10) Patent No.: US 7,863,096 B2
(45) Date of Patent: Jan. 4, 2011

(54) EMBEDDED DIE PACKAGE AND PROCESS FLOW USING A PRE-MOLDED CARRIER

(75) Inventor: Luke England, Portland, ME (US)

(73) Assignee: Fairchild Semiconductor Corporation, South Portland, ME (US)

(*) Notice: Subject to any disclaimer, the term of this patent is extended or adjusted under 35 U.S.C. 154(b) by 82 days.

(21) Appl. No.: 12/175,171

(22) Filed: Jul. 17, 2008

(65) Prior Publication Data
US 2010/0013087 A1 Jan. 21, 2010

(51) Int. Cl.
*H01L 21/44* (2006.01)
(52) U.S. Cl. .............. 438/108; 438/614; 257/E21.507; 257/E21.508
(58) Field of Classification Search .......... 438/107, 438/108, 110, 613, 614, 618, 622; 257/E21.507, 257/E21.508
See application file for complete search history.

(56) References Cited

U.S. PATENT DOCUMENTS

| | | | |
|---|---|---|---|
| 7,011,988 B2* | 3/2006 | Forcier | 438/108 |
| 7,208,344 B2* | 4/2007 | Ho | 438/107 |
| 7,350,296 B2 | 4/2008 | Ryu et al. | |
| 7,371,610 B1 | 5/2008 | Fan et al. | |
| 7,655,500 B2* | 2/2010 | Jiang et al. | 438/106 |
| 2006/0046347 A1 | 3/2006 | Wood et al. | |
| 2007/0158861 A1 | 7/2007 | Huang et al. | |
| 2008/0251903 A1 | 10/2008 | Otremba et al. | |

OTHER PUBLICATIONS

Taylor, Jack "Breakthrough Technology from Freescale Redefines State of the Art for Advanced Semiconductor Packaging Innovative Approach Could Replace Ball Grid Array and Flip Chip as preferred Packaging Technology for Miniaturized Devices", as printed from the WorldWideWeb on Jun. 12, 2008 at http://media.freescale.com/phoenix.zhtml?c=196520&p=irol-newsArticle_print&ID=8858 . . . , pp. 1 and 2.
Freescale Semiconductor article entitled "Redistributed Chip Package (RCP) Technology", 6 pages.

* cited by examiner

*Primary Examiner*—Quoc D Hoang
(74) *Attorney, Agent, or Firm*—Thomas R. FitzGerald, Esq.; Hiscock & Barclay, LLP

(57) ABSTRACT

An embedded die package includes a carrier with an electrical device in the cavity of the carrier, a first dielectric layer covering the sides and top of the electrical device except for vias over selected bonding pads of the electrical device, a plurality of metal conductors, each of which is in contact with at least one of the vias, one or more additional dielectric layers lying over the metal conductors and the first dielectric layer, wherein a top layer of the one or more dielectric layers has openings with metalization underneath coupled to at least one of the metal conductors, and solder bumps protruding from each of the openings.

12 Claims, 4 Drawing Sheets

US 7,863,096 B2

EMBEDDED DIE PACKAGE AND PROCESS FLOW USING A PRE-MOLDED CARRIER

FIELD OF THE INVENTION

This invention relates to packaging for molded electrical device or multiple electrical devices.

BACKGROUND OF THE INVENTION

In the past electrical devices such as semiconductor die have often been packaged by first mounting the device on a leadframe and then making connections to external leads, and then encapsulated. However, as miniaturization of electrical devices has advanced, new packaging techniques have been developed, and are still being developed, for shrinking the packaged semiconductor device or devices by such methods as putting multiple die in a package, and using solder bump interconnects with thin mold coverings.

Although solder bumps and thin molding provide a small package, the semiconductor die is fragile and generally must be packaged with enough rigidity to protect the die and seal the die. Another constraint is that packaging methods, to be economically feasible for the commercial market, need to be versatile so that it can be used with different device sizes and geometries and still provide a package with foot prints which match de facto standards in the industry.

SUMMARY OF THE INVENTION

The invention comprises, in one form thereof, a method of forming an embedded package. The method comprises the steps of forming a carrier having a first plurality of cavities, placing an electrical device in each of the first plurality of cavities, forming a first dielectric layer around and over each of the electrical devices and over the upper surfaces of the carriers, forming vias through the dielectric layer to selected bonding pads on each of the electrical devices, and forming a second plurality of metal conductors, each of which is in contact with one of the vias and extends a distance away from those vias. The method also includes forming one or more additional dielectric layers over each of the second plurality of metal conductors and exposed portions of the first dielectric layer, forming openings in one of the one or more additional dielectric layers over a metal conductor, forming a third plurality of solder bumps each of which is coupled to one of the second plurality of metal conductors; and singulating the first plurality of cavities.

In another form, the invention comprises an embedded die package which includes a pre-molded carrier with a first electrical device in a first cavity of the carrier, a first dielectric layer covering the sides and top of the first electrical device except for vias over selected bonding pads of the electrical device, a first plurality of metal conductors, each of which is in contact with at least one of the vias, one or more additional dielectric layers lying over the metal conductors and the first dielectric layer, wherein a top layer of the one or more dielectric layers has openings over a portion of each of the metal conductors, and a second plurality of solder bumps protruding from each of the openings.

In yet another form, the inventions comprises an embedded die package as described in the above forms, except that the pre-molded carrier is a flat horizontal surface rather than a pre-molded carrier with cavities.

BRIEF DESCRIPTION OF THE DRAWINGS

The aforementioned and other features, characteristics, advantages, and the invention in general will be better understood from the following more detailed description taken in conjunction with the accompanying drawings, in which.

Figure 1A:
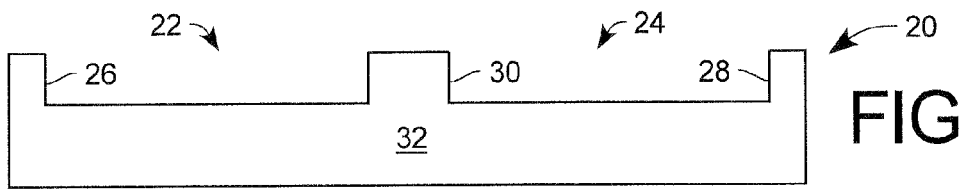
FIG. 1A is a diagrammatical cross sectional view of a pre-molded carrier according to an embodiment of the present invention.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

FIG. 1A is a diagrammatical cross sectional view of a pre-molded carrier 20 formed from encapsulating material such as epoxy molding compound. The carrier 20 shown in FIG. 1 has two cavities 22 and 24 which have an exterior sidewall 26 for cavity 22 and an exterior sidewall 28 for cavity 24. A thicker center wall 30 separates the two cavities 22, 24, which represent two adjacent package sites on the pre-molded carrier. The cavities 22, 24 have a base 32.

Figure 1B:
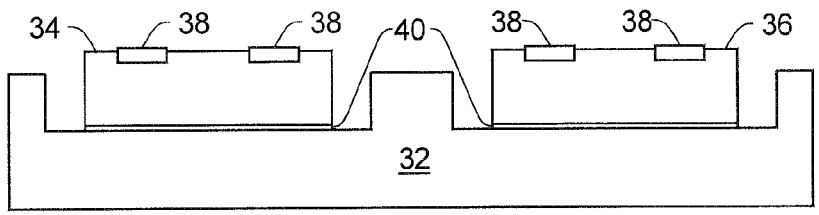
FIG. 1B is a diagrammatical cross sectional view of the pre-molded carrier shown in FIG. 1A after two semiconductor die have been die attached in two cavities of the pre-molded carrier.
Figure 1C:
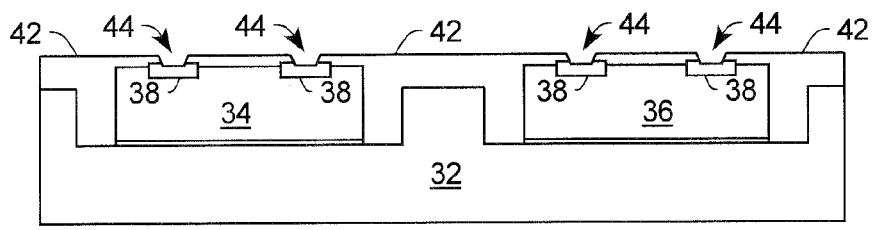
FIG. 1C is a diagrammatical cross sectional view of the pre-molded carrier shown in FIG. 1B after a first dielectric layer has been formed.

FIG. 1B shows the pre-molded carrier 20 after two semiconductor die 34 and 36 have been die attached in the cavities 22 and 24, respectively. In FIG. 1B the semiconductor dies 34 and 36 extend above the side walls 26, 28 and the center wall 30 of the pre-molded carrier 20. Each of the semiconductor dies 34 and 36 have bond pads 38. The die attachment can be made with standard die-attach methods such as, but not limited to, epoxy or a die attach film 40. In FIG. 1C dielectric material 42 fills the gaps between the semiconductor dies 34 and 36, the sidewalls 26, 28, and the center wall 30, and extends above and on top of the semiconductor dies 34 and 36. Vias 44 have been made through the dielectric material 42 to the bond pads 38.

The dielectric material 42 may be formed in any of several know methods, including using the process of vacuum film lamination with a material such as Ajinomoto Build-Up FILM (ABF) followed by laser drilling of the vias 44. The vias 44 can also be formed by spin coating or spray coating of polyimide or photoresist followed by photolithography.

Figure 1D:
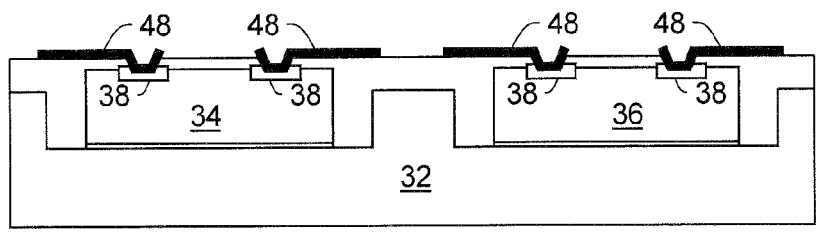
FIG. 1D is a diagrammatical cross sectional view of the pre-molded carrier shown in FIG. 1C after metal interconnects have been formed.

Metallization is deposited, patterned and etched to form metal interconnects 48 from the bond pads 38 to locations not directly over the semiconductor dies 22 and 24, as shown in FIG. 1D. In one embodiment of the present invention, the metallization is formed by first coating the surface of the dielectric layer 42 and the exposed bond pads 38 with a thin metal seed layer through electroless Cu plating or Cu sputter deposition, putting down a patterned photoresist layer, and electroplating additional metal in the exposed areas of the thin metal layer. The photoresist is then removed and the metal seed layer is removed using acid etching. In another embodiment of the present invention, the metal interconnects are formed by Al sputter deposition to the desired final interconnect thickness. A photoresist layer is then deposited and patterned to match the interconnect routing. The Al metal is etched away followed by photoresist removal, which leaves the final interconnect pattern.

Figure 1E:
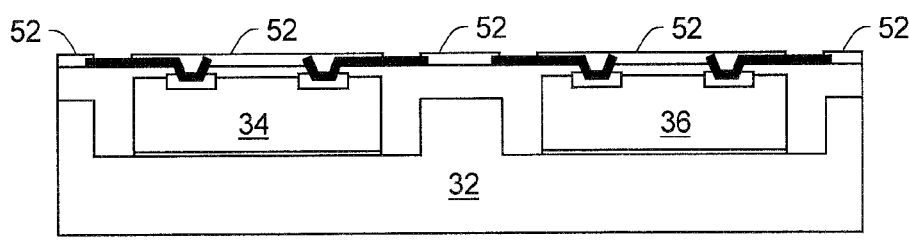
FIG. 1E is a diagrammatical cross sectional view of the pre-molded carrier shown in FIG. 1D after a second dielectric layer has been formed.

With reference to FIG. 1E, after the metal interconnects 48 are formed, a second dielectric layer 52 is then applied and patterned over the first level of dielectric material 42 and the metal interconnects 48. This process for dielectric layer 52 application may match the process for the first dielectric layer 42 application.

Figure 1F:
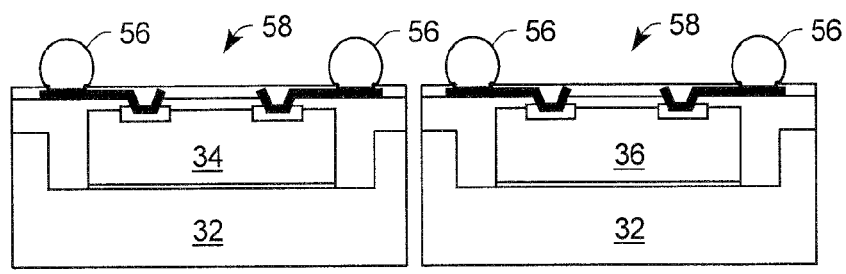
FIG. 1F is a diagrammatical cross sectional view of the pre-molded carrier shown in FIG. 1E after solder bumps have been formed.

In FIG. 1F solder bumps 56 have been formed using one of several known processes such as, but not limited to, stencil printing or ball drop followed by a reflow cycle. Depending on the interconnect metal composition, a solderable under bump metallization (UBM) layer may be required. This can be achieved through electroless plating methods. The formation of the embedded die packages 58 are completed by the singulation of the two packages.

Figure 2A:
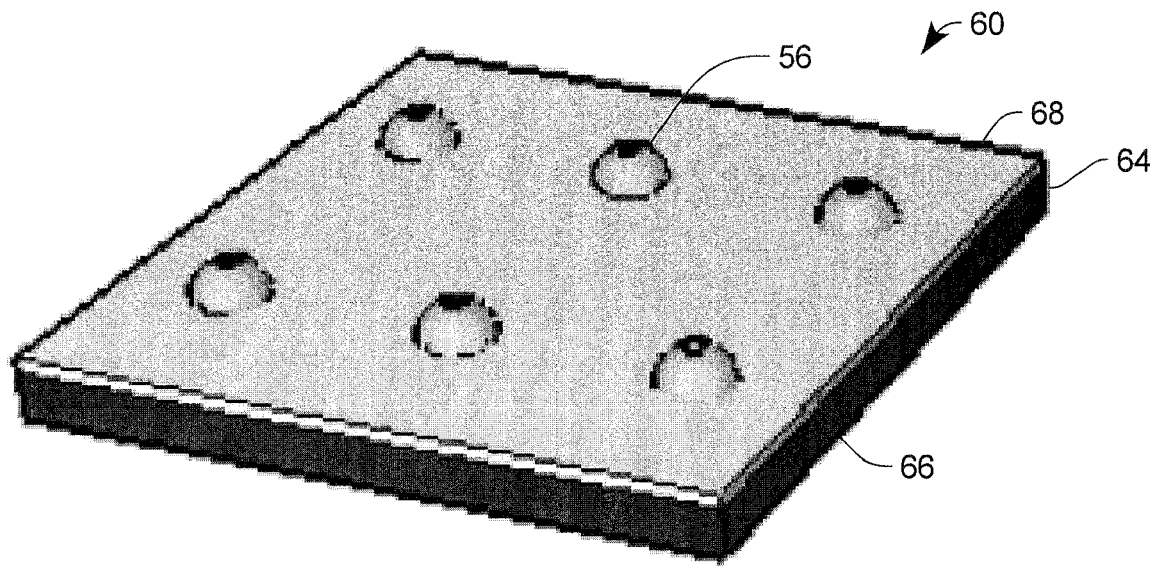
FIGS. 2A and 2B show respective top and bottom perspective views of a packaged semiconductor die according to an embodiment of the present invention.
Figure 2B:
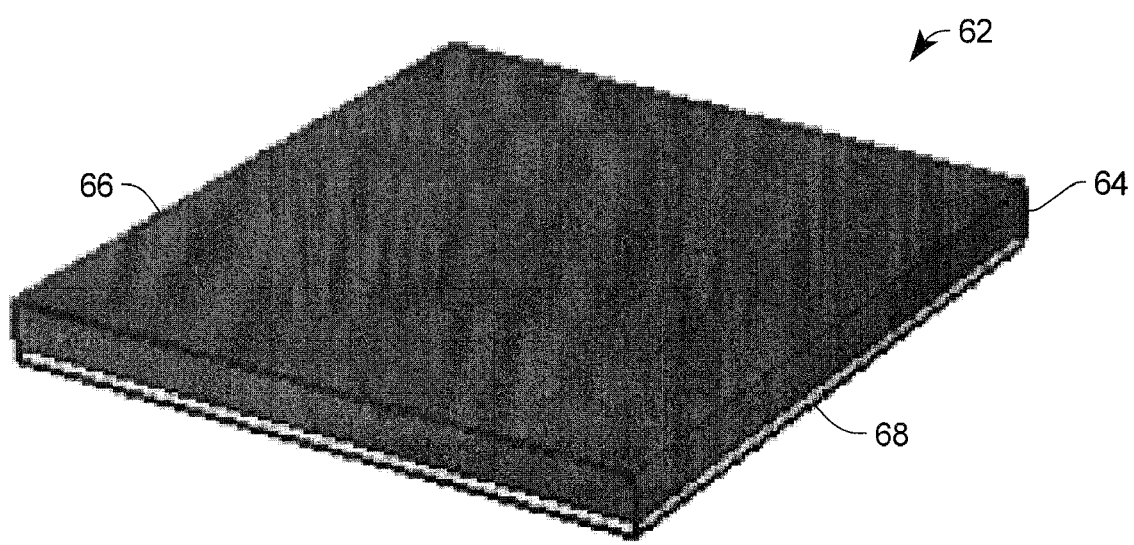

FIGS. 2A and 2B show respective top 60 and bottom 62 perspective views of a packaged semiconductor die 64 according to an embodiment of the present invention. The package shown in these figures have a pre-molded carrier 66, a second dielectric layer 68 has the solder bumps 56 protruding through.

Figure 3A:
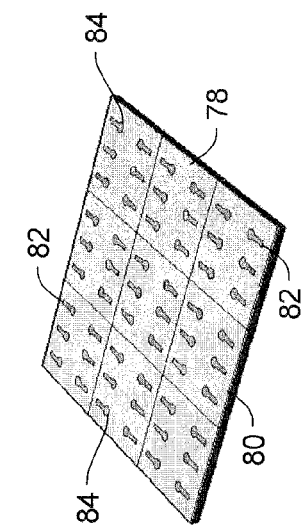
FIGS. 3A, 3B, 3C, 3D, 3E, and 3F show various stages in the forming of embedded die packages according to an embodiment of the present invention.
Figure 3B:
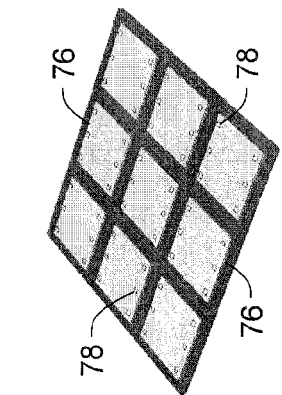

FIGS. 3A-3F show various stages in the forming of the embedded die packages 70 according to an embodiment of the present invention. FIG. 3A shows a pre-molded carrier 72 with a matrix of nine cavities 74. Semiconductor dies 76 are placed in each of the six cavities 74 as shown in FIG. 3B.

Figure 3C:
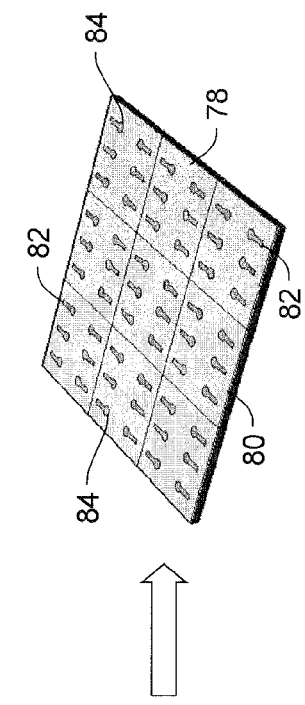
Figure 3D:
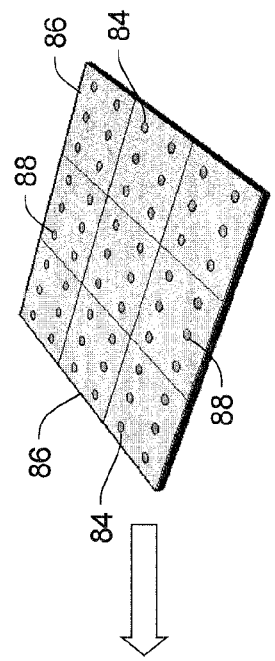

FIG. 3C shows the embedded die packages after a first dielectric layer 80 has been formed over the dies 76, vias have been formed in the first dielectric layer 80, and metal conductors 82 have been formed between each of the bond pads 78 and sites 84 where the solder bumps 56 will be placed. Then a second dielectric layer 86 is formed over the first dielectric layer 80 and the metal conductors 82, and openings 88 are made in the second dielectric layer 86 to expose the sites 84 for the solder bumps 56 as shown in FIG. 3D.

Figure 3E:
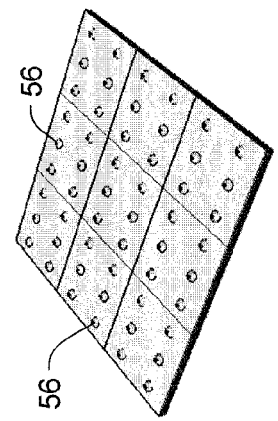
Figure 3F:
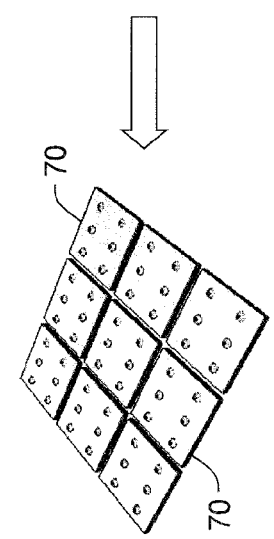

FIG. 3E shows the solder bumps 56 in place on the sites 84, and FIG. 3F shows the individual die packages 70 after a singulation process.

Figure 4:
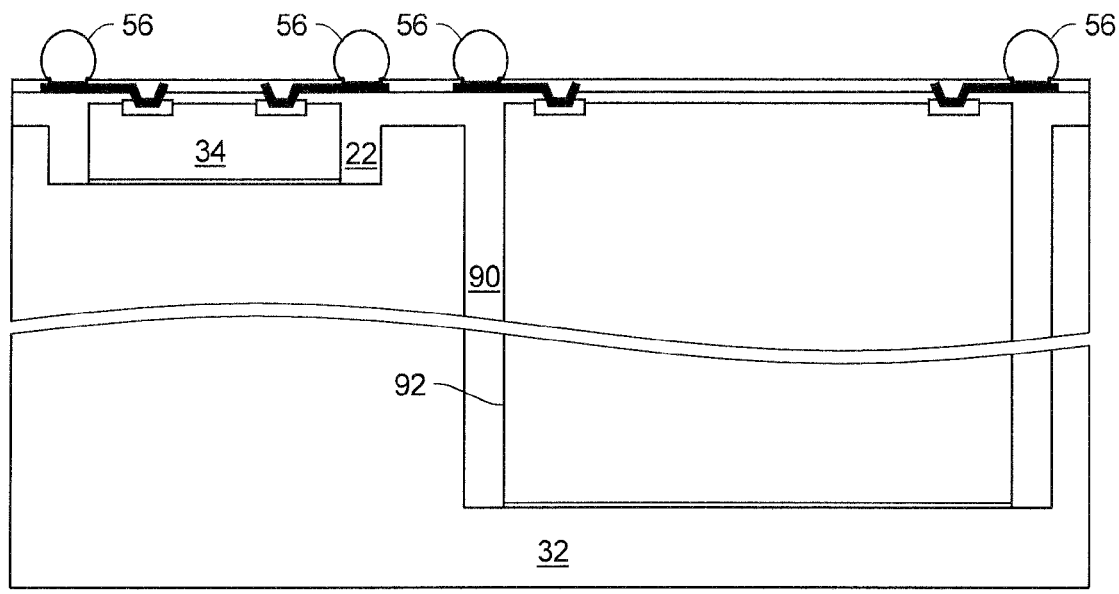
FIGS. 4, 5, and 6 are diagrammatical cross sectional views that show some of the embodiments possible in practicing the current invention.
Figure 5:
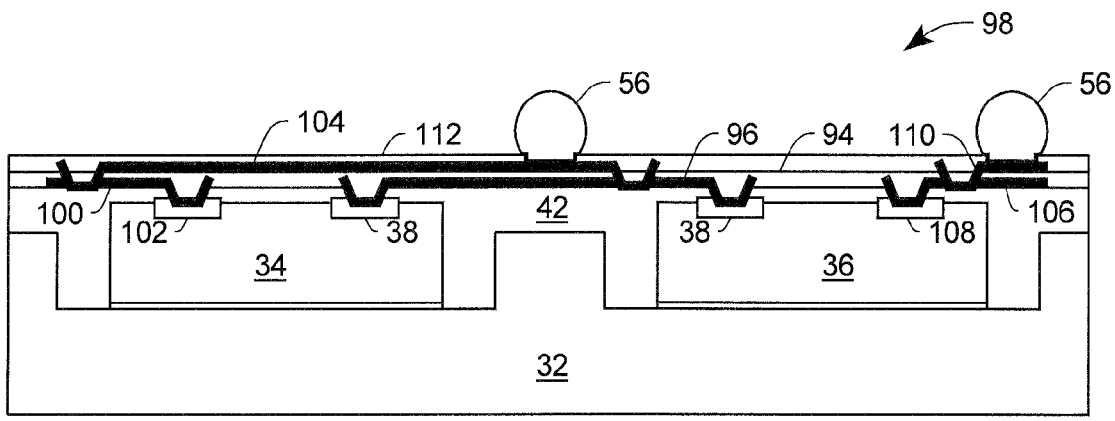
Figure 6:
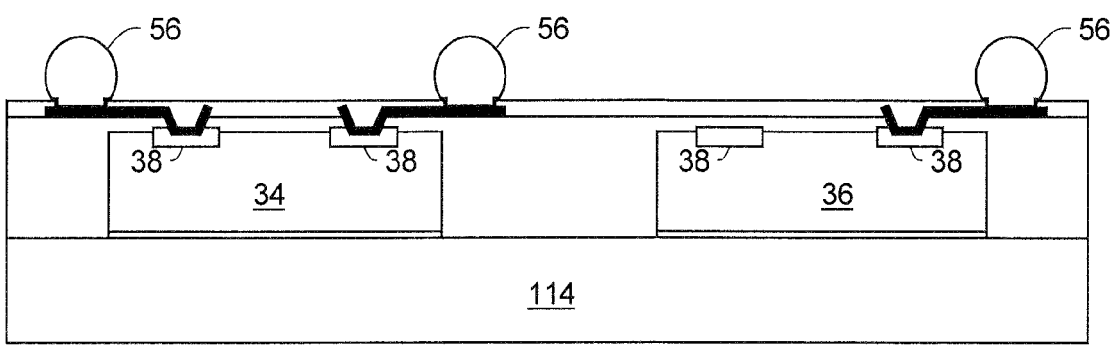

FIGS. 4, 5, and 6 show some of the embodiments possible in practicing the current invention. In FIG. 4 the semiconductor die 34 is in a cavity 22 which is next to a much deeper cavity 90 which contains a passive electrical element 92 such as an inductor, a resistor, or a capacitor. The semiconductor die 34 may have a height of about 20 μm and the electrical element 92 may have a height of 1 mm, but the height of each can vary with application requirements. In addition, the widths of the semiconductor die 34 and the electrical element 92 may be different as shown in FIG. 4. Thus the pre-molded carrier 94 is formed to accommodate the heights and widths of the semiconductor die 34 and the electrical element 92.

FIG. 5 is a diagrammatical cross sectional view of a pre-molded carrier according to another embodiment of the present invention with interconnection metalization made between the two semiconductor die 34 and 36. Interconnections can be made at different vertical levels using general PC board or redistribution layer technology. In FIG. 5 a metal interconnect 96 lies between a the first dielectric layer 42 and a second dielectric layer 94 that may be thicker than the second dielectric layer 52 shown in FIG. 1E. The metal interconnect 96 connects together bonding pads 38 of semiconductor dies 34 and 36 as part of an embedded die package 98 which is a multi-chip package. A metal interconnect 100 forms a connection from a bonding pad 102 to a metal interconnect 104 which lies on the second dielectric layer 94 which extends to the metal interconnect 96. Another metal interconnect 106 forms a connection from bonding pad 108 to a second metal interconnect 110 lying on the second dielectric layer 94. A third dielectric layer 112 covers the metal interconnects 104 and 110 and the exposed regions of the second dielectric layer 94. Also shown in FIG. 5 are solder bumps 56 which extend through openings in the third dielectric layer 112 to the metal interconnects 104 and 110.

In FIG. 6 the pre-molded carrier 114 does not have sidewalls 26, 28 or center walls 30, but rather has a flat horizontal surface. The process described above with respect to FIGS. 1A-F is still applicable to forming the embodiment shown in FIG. 6. In applications in which a bonding pad 38 is not used, there may be no metal interconnect to the bonding pad in the embedded die package, an example of which is shown in FIG. 6.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A method of forming an embedded multi-chip package comprising the steps of:

forming a carrier having a plurality of cavities;

placing an electrical device in each of said cavities;

forming a first dielectric layer around and over each of said electrical devices and over the upper surfaces of said carrier;

forming first level vias through said first dielectric layer to selected bonding pads on each of said electrical devices;

forming a plurality of first metal conductors, each of which is in contact with a selected bond pad and extends a distance away from one of said first level vias, and one or more first metal conductors in contact with two selected bond pads;

forming a second dielectric layer over said plurality of first metal conductors;

forming second level vias in said second dielectric layer over said plurality of first metal conductors;

forming a plurality of second metal conductors in said second level vias, each of said second metal conductors to contact one of said first metal conductors; and forming a plurality of solder bumps each of which is coupled to one of said plurality of second metal conductors.

2. The method set forth in claim 1 wherein said carrier is formed by a molding process.

3. The method set forth in claim 1 including the additional step of attaching said electrical device to said carrier.

4. The method set forth in claim 1 wherein said electrical device is an active device.

5. The method set forth in claim 1 wherein said electrical device is a passive device.

6. The method set forth in claim 1 wherein said first dielectric layer is formed by a lamination process.

7. The method set forth in claim 6 wherein said vias are formed by laser drilling.

8. The method set forth in claim 6 wherein said vias are formed by photolithography.

9. The method set forth in claim 1 wherein at least one of said electrical devices is an active device and at least another of said electrical devices is a passive device.

10. The method as set forth in claim 1 wherein the carrier is premolded to provide cavities for holding electrical devices of heights and different widths.

11. A method of forming an embedded multi-chip package comprising the steps of:

forming a pre-molded carrier having a plurality of cavities;

placing an electrical device in each of said cavities;

forming a first dielectric layer around and over each of said electrical devices and over the upper surfaces of said carrier;

forming first level vias through said first dielectric layer to selected bond-pads on each of said electrical devices;

forming a plurality of first metal conductors, each of which fills a first level via and contacts a bond pad and extends a distance away from said vias and one or more first metal conductors in contact with two bond pads;

forming a second dielectric layer over said plurality of metal conductors;

forming second level vias in the second dielectric layer over the first metal conductors;

forming second metal conductors on the second dielectric layer and in the second level vias to contact one of said first metal conductors in the second level via; and forming a plurality of solder bumps each of which is coupled to one of said second metal conductors.

12. The method as set forth in claim 11 wherein the carrier is premolded to provide cavities for holding electrical devices of different heights or different widths or both.

* * * * *